(12) United States Patent
Chung

(10) Patent No.: US 8,399,294 B2
(45) Date of Patent: Mar. 19, 2013

(54) SEMICONDUCTOR PACKAGE FOR DISCHARGING HEAT AND METHOD FOR FABRICATING THE SAME

(75) Inventor: Qwan Ho Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/584,042

(22) Filed: Aug. 13, 2012

(65) Prior Publication Data

US 2012/0309129 A1  Dec. 6, 2012

Related U.S. Application Data

(62) Division of application No. 12/432,922, filed on Apr. 30, 2009, now Pat. No. 8,264,087.

(30) Foreign Application Priority Data

Oct. 9, 2008 (KR) .................. 10-2008-0099260

(51) Int. Cl.
   *H01L 21/00* (2006.01)
(52) U.S. Cl. ........ 438/106; 438/107; 438/113; 438/123; 438/125; 438/15; 257/706; 257/774; 257/779; 257/E23.011
(58) Field of Classification Search .................. 257/706, 257/774, 779, E23.011; 438/106, 107, 113, 438/123, 125, 15
See application file for complete search history.

(56) References Cited

U.S. PATENT DOCUMENTS

| 6,590,291 | B2 * | 7/2003 | Akagawa ........ 257/774 |
| 6,774,478 | B2 * | 8/2004 | Eto et al. ........ 257/686 |
| 7,514,770 | B2 * | 4/2009 | Chang et al. ........ 257/678 |
| 2002/0046880 | A1 * | 4/2002 | Takubo et al. ........ 174/261 |
| 2004/0188069 | A1 * | 9/2004 | Tomioka et al. ........ 165/104.33 |
| 2006/0103011 | A1 * | 5/2006 | Andry et al. ........ 257/707 |
| 2006/0219396 | A1 * | 10/2006 | Abei et al. ........ 165/164 |
| 2007/0085188 | A1 | 4/2007 | Chang et al. |
| 2008/0272485 | A1 * | 11/2008 | Myers et al. ........ 257/714 |
| 2009/0065923 | A1 * | 3/2009 | Chung ........ 257/687 |

FOREIGN PATENT DOCUMENTS

| JP | 2001-308470 A | 11/2001 |
| JP | 2001308470 A | * 11/2001 |
| JP | 2002-026187 A | 1/2002 |
| KR | 1020000033452 A | 6/2000 |
| KR | 1020030046791 A | 6/2003 |

OTHER PUBLICATIONS

USPTO RR mailed Jun. 23, 2011 in connection with U.S. Appl. No. 12/432,922.
USPTO NFOA mailed Aug. 18, 2011 in connection with U.S. Appl. No. 12/432,922.
USPTO NFOA mailed Dec. 12, 2011 in connection with U.S. Appl. No. 12/432,922.
USPTO NOA mailed Jun. 6, 2012 in connection with U.S. Appl. No. 12/432,922.

\* cited by examiner

*Primary Examiner* — Telly Green
(74) *Attorney, Agent, or Firm* — Ladas & Parry LLP

(57) ABSTRACT

A semiconductor package for quickly discharging heat and a method for fabricating the same are disclosed. The semiconductor package includes a semiconductor package module having a first insulation member and at least one fluid passage passing through the insulation member. Circuit patterns are formed on a first face of the first insulation member. Semiconductor chips are then disposed on the first face and are electrically connected with the circuit patterns respectively. A second insulation member is formed so as to surround the side faces of the semiconductor chips, the first insulation member, and the circuit patterns. Finally, a through electrode is formed passing through the second insulation member of the semiconductor package module and electrically connecting to the circuit patterns.

4 Claims, 12 Drawing Sheets

SEMICONDUCTOR PACKAGE FOR DISCHARGING HEAT AND METHOD FOR FABRICATING THE SAME

CROSS-REFERENCE TO RELATED APPLICATIONS

The present application claims priority to Korean patent application number 10-2008-0099260 filed on Oct. 9, 2008, which is incorporated herein by reference in its entirety.

BACKGROUND OF THE INVENTION

The present invention relates generally to a semiconductor package and a method for fabricating the same, and more particularly, to a semiconductor package capable of quickly discharging heat generated from the semiconductor package and method for fabricating the same.

Generally, a semiconductor package is fabricated through a semiconductor chip fabrication process, an electrical inspection process, and a packaging process. In the semiconductor chip fabrication process, devices such as a transistor, a resistor and a capacitor are formed as thin film shapes on a wafer. In the electrical inspection process, the semiconductor chip is electrically inspected to separate good semiconductor chips from bad semiconductor chips that are formed on the wafer. In the packaging process, the brittle semiconductor chip is processed in order to protect the semiconductor chip from external shock and/or vibration.

A semiconductor package including a semiconductor device is utilized in many devices such as personal computers, television receivers, home appliances, information and communication equipments, and the like.

In recent years, a "chip scale package" having a size no more than 100-105% of a semiconductor chip has been developed in accordance with the development of semiconductor packaging technology. Additionally, a "stacked semiconductor package" has to recently been developed in which a plurality of semiconductor chips and/or semiconductor packages are stacked together to enhance the data storage capacity and data processing speed of the package.

SUMMARY OF THE INVENTION

Embodiments of the present invention are directed to a semiconductor package with slimed thickness, enhanced reliability, increased deflection resistance, and enhanced heat radiation property.

Embodiments of the present invention are also directed to a method for fabricating the semiconductor package.

In one embodiment of the present invention, a semiconductor package includes a semiconductor package module including a first insulation member having an insulation body and at least one fluid passage passing through an inside of the insulation member, circuit patterns formed over a first face of the first insulation member, semiconductor chips disposed over the first face and electrically connected with the circuit patterns respectively and a second insulation member surrounding side faces of the semiconductor chips; and a through electrode passing through the second insulation member of the semiconductor package module and electrically connected with the circuit patterns.

Preferably, a plurality of the fluid passages is disposed parallel to each other.

The semiconductor package may further include a fluid supply unit for providing fluid to a first end of the respective fluid passage; and a fluid collection unit connected to a second end of the fluid passage opposing to the first end of the fluid passage and collecting the fluid.

Preferably, at least two semiconductor package modules are stacked.

The semiconductor package may further includes a first connection pipe for connecting the fluid passages included in the odd-th semiconductor package modules of the stacked semiconductor package modules with each other; and a second connection pipe for connecting the fluid passages included in the even-th semiconductor package modules of the stacked semiconductor package modules with each other.

The semiconductor package may further includes a fluid supply unit for providing fluid to a first end of a fluid passage connected into one piece by the first connection pipes; and a fluid collection unit connected to a second end opposing to a first end of a fluid passage connected into one piece by the second connection pipes.

The semiconductor package may further include a cover member for covering the upmost semiconductor package module of the stacked semiconductor package modules.

The cover member may further include an additional circuit to pattern disposed over an upper face of the cover member, and the additional circuit pattern is electrically connected with the through electrode.

The first insulation member includes connection pads disposed over the other face opposing to the first face and electrically connected with the through electrode; and bump structures disposed over the respective connection pads.

The semiconductor package may further include an insulation film for covering the semiconductor chips and the second insulation member; and an additional circuit pattern disposed over the insulation film and electrically connected with the through electrode.

In another embodiment of the present invention, a semiconductor package includes a semiconductor package module in which at least two sub-semiconductor packages are stacked, each sub-semiconductor package including a first insulation member, circuit patterns formed over a first face of the first insulation member, semiconductor chips disposed over the first face and electrically connected with the circuit patterns respectively and a second insulation member surrounding side faces of the semiconductor chips; and a through electrode passing through the second insulation member of the semiconductor package module and electrically connected with the circuit patterns, wherein the semiconductor package further comprises at least one fluid passage passing through an inside of the first insulation member of the lowermost semiconductor package of the stacked semiconductor packages.

In yet another embodiment of the present invention, a method for fabricating a semiconductor package includes forming a semiconductor package module including a first insulation member formed with circuit patterns over a first face thereof and having at least one fluid passage therein, semiconductor chips electrically connected with the circuit patterns and a second insulation member covering side faces of the semiconductor chips; and forming a through electrode passing through the second insulation member and electrically connected with the circuit patterns.

The method may further include, before the step of forming the through electrode, stacking at least two semiconductor package modules.

The method may further include, after the step of forming the through electrode, connecting a fluid supply unit for providing fluid to a first end of the fluid passage; and connecting a fluid collecting unit for collecting the fluid to a second end opposing to the first end of the fluid passage.

The step of forming the semiconductor package module includes forming an insulation film having an opening for exposing the through electrode over the semiconductor chips and the second insulation member; and forming an additional circuit pattern electrically connected with the through electrode over the insulation film.

DESCRIPTION OF SPECIFIC EMBODIMENTS

Figure 1:
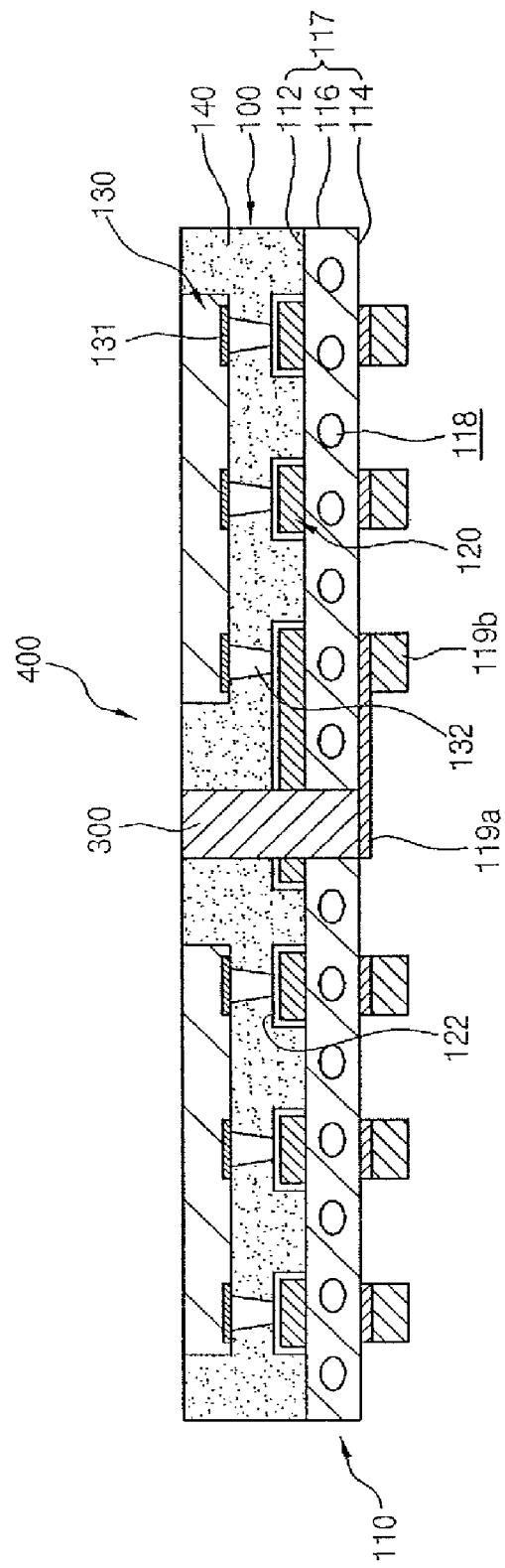
FIG. 1 is a cross-sectional view showing a semiconductor package in accordance with an embodiment of the present invention.

FIG. 1 is a cross-sectional view showing a semiconductor package in accordance with an embodiment of the present invention.

Referring to FIG. 1, a semiconductor package 400 includes a semiconductor package module 100 and a through electrode 300.

The semiconductor package module 100 includes a first insulation member 110, circuit patterns 120, semiconductor chips 130, and a second insulation member 140.

The first insulation member 110 has, for example, a substantially planar shape. Structurally, the first insulation member 110 includes an insulation body 117 having a first face 112, a second face 114 opposite the first face 112, side faces 116 connecting the first face 112 and the second face 114, and fluid passages 118.

The fluid passages 118 are formed between the first face 112 and the second face 114 of the first insulation member 110. The fluid passage 118 can be a through hole which passes through the opposing side faces 116 and between the first face 112 and the second face 114. The fluid passage 118 can be formed in a linear shape or a curved shape when viewing the plane of the first insulation member 110 from above.

For example, a plurality of fluid passages 118 can be disposed parallel to each other within the first insulation member 110. Alternatively, a single fluid passage 118 can be disposed in a curved shape within the first insulation member 110.

Fluids such as liquid and coolant, as well as gas, may pass through the fluid passage 118. Heat generated from the is semiconductor chip 130 is quickly discharged to the outside of the semiconductor package 400 by the fluid passage 118 and the fluid passing through the fluid passage 118, thereby further enhancing an operational property of the semiconductor chip 130.

The circuit patterns 120 are disposed on the first face 112 of the first insulation member 110. The circuit patterns 120 are electrically connected to the semiconductor chips 130 and the through electrodes 300, which will be described later. The circuit patterns 120 can contain, for example, copper or copper alloy.

In order to enhance an adhesive force between the circuit pattern 120 and a bump formed to the semiconductor chip 130 described later, the circuit pattern 120 can include a plating layer 122. Examples of the material for the plating layer 122 may include gold, nickel, palladium and an alloy thereof.

Meanwhile, the first insulation member 110 in accordance with the current embodiment of the present invention may further include a connection pad 119a and an external connection bump 119b. The connection pad 119a is disposed on the second face 114 of the first insulation member 110 and the external connection to bump 119b is disposed on the connection pad 119a.

The semiconductor chip 130 is disposed over the first face 112 of the first insulation member 110 and the semiconductor chip 130 and the circuit pattern 120 are electrically connected. The semiconductor chip 130 includes a circuit unit (not shown) having a is data storage unit (not shown) for storing data and a data processing unit (not shown) for processing the data. The semiconductor chip 130 also includes a bonding pad 131 electrically connected to the circuit unit and a bump 132 connected to the bonding pad 131. The bump 132 may contain a solder, gold, a gold alloy and the like, and the bump 132 is formed in a column shape protruding from the bonding pad 131.

The semiconductor chip 130 and the bump 132 are bonded to the circuit pattern 120 in a flip chip manner. Alternatively, the bonding pad 131 of the semiconductor chip 130 may be disposed opposite to the first face 112 of the first insulation member 110. The bonding pad 131 and the circuit pattern 120 may then be electrically connected through a conductive wire (not shown) without the bump 132.

In the present embodiment, at least two semiconductor chips 130 can be disposed on the first insulation member 110, and the semiconductor chips 130 can be of the same kind or different kinds of semiconductor chips.

Meanwhile, the circuit pattern 120 may be electrically m connected to not only the semiconductor chip 130, but also to passive devices such a diode, a transistor, an inductor, and a resistor.

The second insulation member 140 surrounds the side faces of the semiconductor chip 130 and exposes the upper face of the semiconductor chip 130. That is, the second insulation member 140 is formed in the areas between the semiconductor chip 130 and the first face of the first insulation member 110. In the present embodiment, the second insulation member 140 can be an epoxy resin or a thermosetting resin. In the present embodiment, the upper face of the second insulation member 140 and the upper face of the semiconductor chip 130 are formed to have a substantially planar combined face.

The through electrode 300 passes through the first insulation member 120 and the second insulation member 140. The through electrode 300 is electrically connected to the circuit pattern 120 and the connection pad 119a. The through electrode 300 has a column shape and the through electrode 300 can include copper or copper alloy.

A plurality of through electrodes 300 are provided and can be disposed in a zigzag shape when viewed from above the plane where the through electrodes 300 are disposed in order to maximize the formation of more through electrodes in a limited area.

Figure 2:
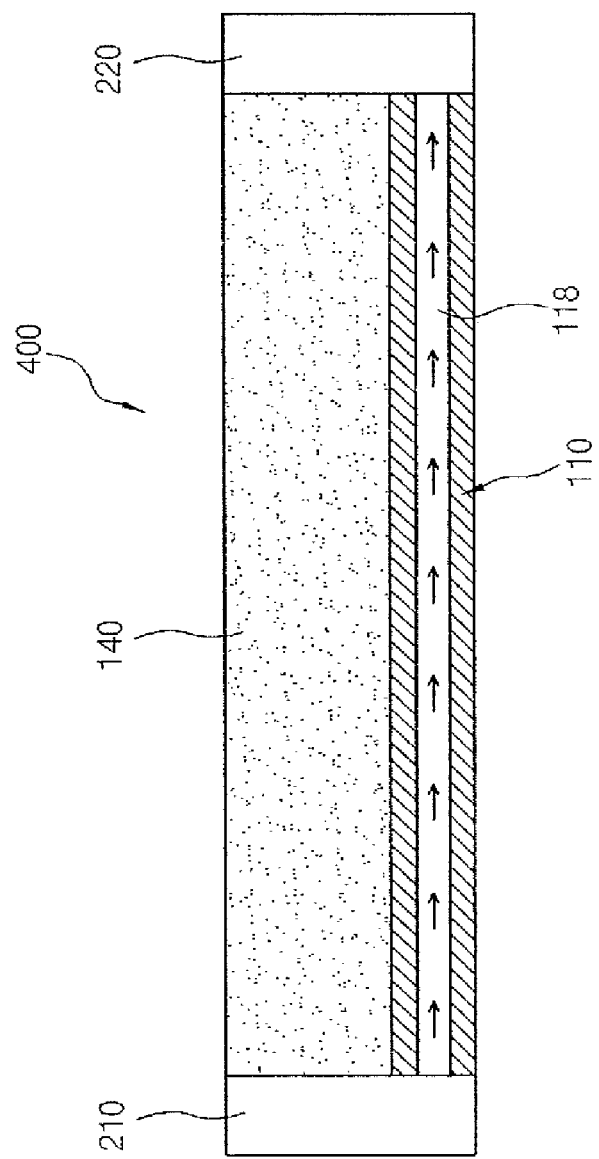
FIG. 2 is a cross-sectional view showing a fluid supply unit and a fluid collection unit provided in the semiconductor package according to the embodiment of the present invention shown in FIG. 1.

FIG. 2 is a cross-sectional view showing a fluid supply unit and a fluid collection unit provided in the semiconductor package in accordance with the embodiment of the present invention shown in FIG. 1.

Referring to FIG. 2, a first end of the fluid passage 118 of is the first insulation member 110 is connected to a fluid supply unit 210 for supplying the fluid to the fluid passage 118 and a second end of the fluid passage 118 is connected to a fluid collection unit 220 for collecting the cooling fluid supplied from the fluid supply unit 210 in order to provide fluid for cooling the semiconductor package 400. The fluid collected in the fluid collection unit 220 is circulated back to the fluid supply unit 210 through a bypass pipe (not shown).

It is possible to quickly discharge the heat generated from the semiconductor package 400 and thus enhance the performance of the semiconductor package 400 by providing the fluid to the fluid passage 118 using the fluid collection unit 220 and the fluid supply unit 210.

Figure 3:
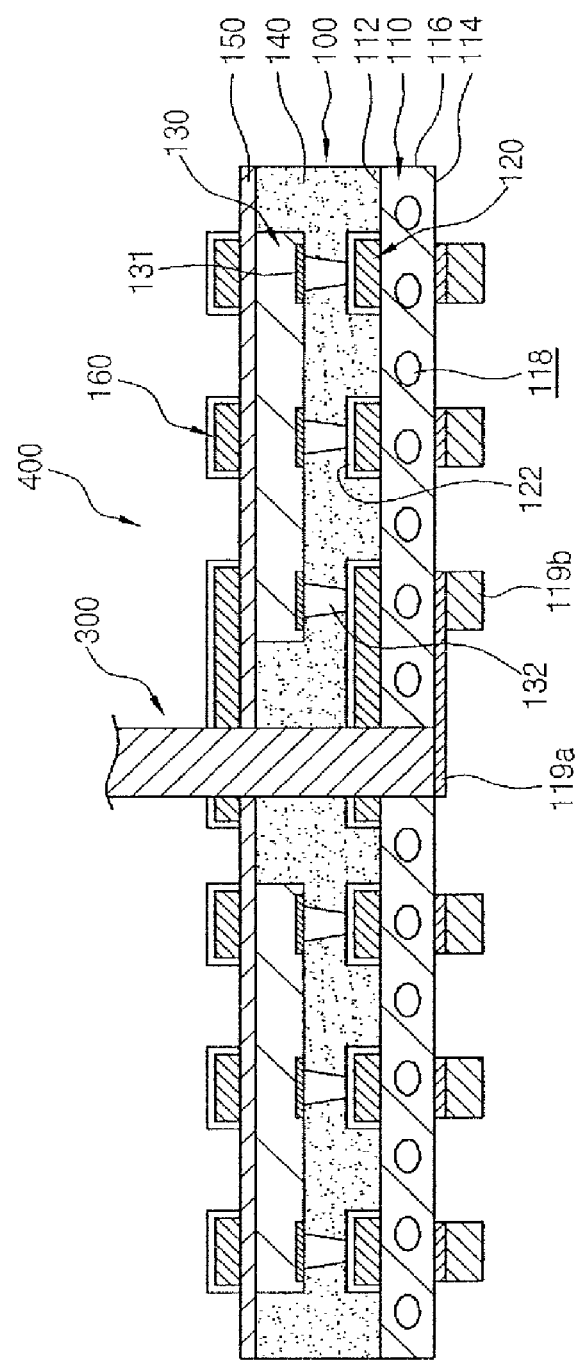
FIG. 3 is a cross-sectional view showing a semiconductor package in accordance with another embodiment of the present invention.

FIG. 3 is a cross-sectional view showing a semiconductor package in accordance with another embodiment of the present invention. The semiconductor package shown in FIG. 3 is substantially the same as the semiconductor package shown in FIG. 1, except for an insulation film and an additional insulation pattern. Therefore, identical reference numerals and names will be given to to corresponding identical parts and a duplicated description of the identical parts will be omitted.

Referring to FIG. 3, the semiconductor package 400 includes the semiconductor package module 100, the through electrode 300, an insulation film 150, and an additional circuit is pattern 160.

The insulation film 150 covers the upper faces of the second insulation member 140 and the semiconductor chip 130. The insulation film 150 can be an organic film or an inorganic film. The insulation film 150 has openings for exposing the respective through electrodes 300.

The additional circuit pattern 160 is disposed on the insulation film 150. In the present embodiment, the additional circuit pattern 160 is electrically connected to the through electrode 300 that is exposed via the opening formed in the insulation film 150.

The additional circuit pattern 160 can be electrically connected with a connection member such as a solder ball, an additional semiconductor chip (not shown), or passive devices.

Figure 4:
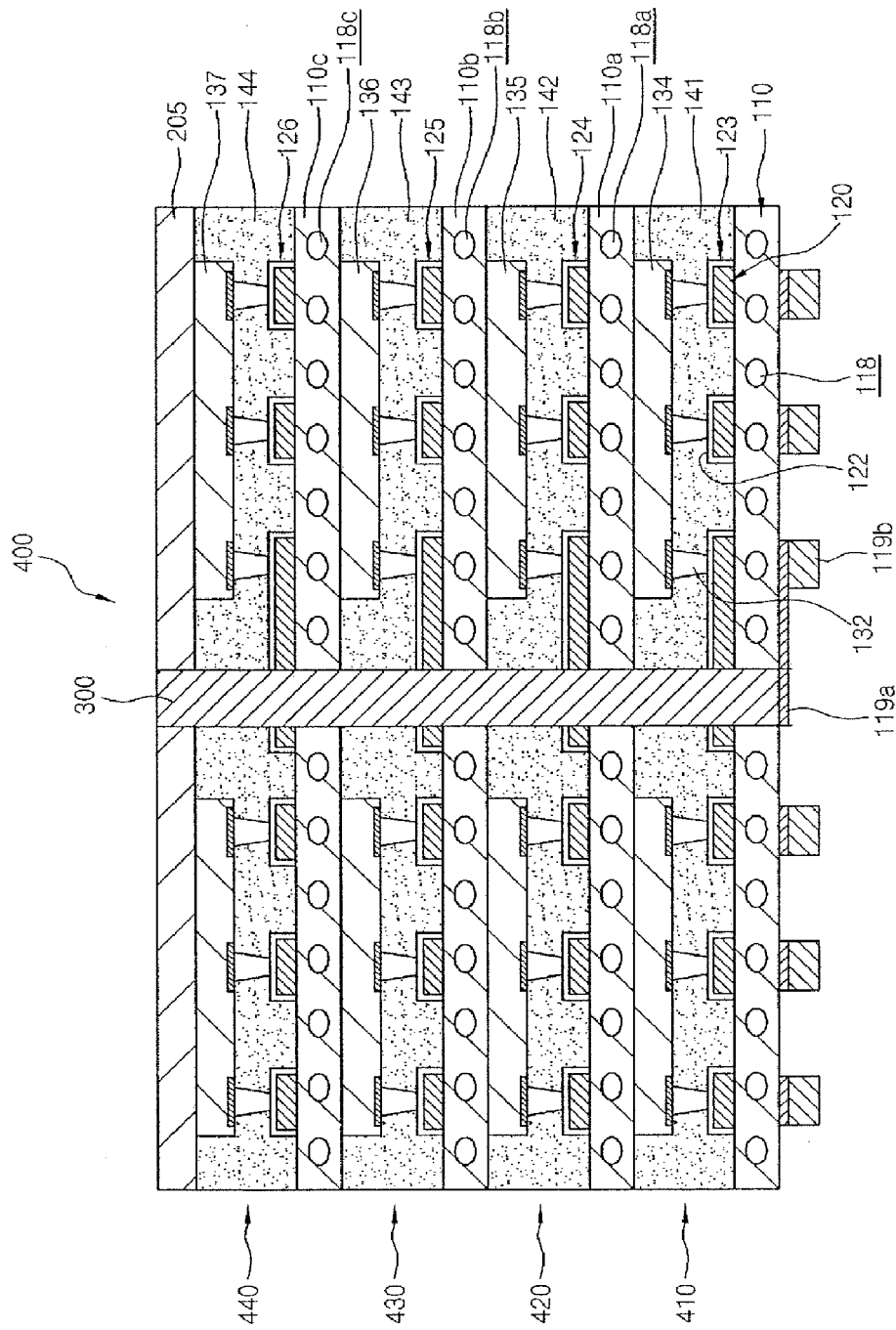
FIG. 4 is a cross-sectional view showing a semiconductor package in accordance with another embodiment of the present invention.

FIG. 4 is a cross-sectional view showing a semiconductor package in accordance with another embodiment of the present invention.

Referring to FIG. 4, the semiconductor package 400 shown in FIG. 1 can be stacked multiple times as shown in FIG. 4 to enhance the data storage capacity and the data processing speed.

The semiconductor package 400 in accordance with the present embodiment includes a first semiconductor package module 410, a second semiconductor package module 420, a third semiconductor package module 430, a fourth semiconductor is package module 440, and the through electrode 300.

In the present embodiment, each of the first through fourth semiconductor package modules 410, 420, 430, 440 has substantially the same configuration as the semiconductor package 400 shown in FIG. 1. In the present embodiment, identical names and reference numerals will be given to corresponding identical parts of the first through fourth semiconductor package modules 410, 420, 430, 440. However, in some cases, different numerals will be given to clarify the description.

The first semiconductor package module 410 includes a circuit pattern 123, a first insulation member 110 having a fluid passage 118, a semiconductor chip 134 having a bump 132 connected to the circuit pattern 123, and a second insulation member 141 surrounding side faces of the semiconductor chip 134.

The second semiconductor package module 420 is disposed on the first semiconductor package module 410 in a stacked structure. The second semiconductor package module 420 includes a circuit pattern 124, a first insulation member 110a having a fluid passage 118a, a semiconductor chip 135 having a m bump connected to the circuit pattern 124, and a second insulation member 142 surrounding side faces of the semiconductor chip 135. In the present embodiment, the semiconductor chip 134 of the first semiconductor package module 410 is attached to the first insulation member 110a of the second semiconductor package is module 420.

The third semiconductor package module 430 is disposed on the second semiconductor package module 420. The third semiconductor package module 430 includes a circuit pattern 125, a first insulation member 110b having a fluid passage 118b, a semiconductor chip 136 having a bump connected to the circuit pattern 125, and a second insulation member 143 surrounding side faces of the semiconductor chip 136. In the present embodiment, the semiconductor chip 135 of the second semiconductor package module 420 is attached to the first insulation member 110b of the third semiconductor package module 430.

The fourth semiconductor package module 440 is disposed on the third semiconductor package module 430. The fourth semiconductor package module 440 includes a circuit pattern 126, a first insulation member 110c having a fluid passage 118c, a semiconductor chip 137 having a bump connected to the circuit pattern 126, and a second insulation member 144 surrounding side faces of the semiconductor chip 137. In the present embodiment, the semiconductor chip 136 of the third semiconductor package module 430 is attached to the first insulation member 110c of the fourth semiconductor package module 440.

The through electrode 300 passes through the first through fourth semiconductor packages 410, 420, 430, 440 and is electrically connected to the circuit patterns 123, 124, 125, 126. The through electrode 300 passes through the first insulation member 110 and is electrically connected to a connection pad 119a disposed on a rear face of the first insulation substrate 110. The rear face of the first insulation substrate 110 in FIG. 4 is the same as the second face 114 shown in FIG. 1.

Meanwhile, the semiconductor package 400 in accordance with the present embodiment may further include a cover unit 205. The cover unit 205 covers the semiconductor chip 137 and the second insulation member 144 of the fourth semiconductor package module 440. An additional circuit pattern (not shown) connected to the through electrode 300 may be formed over an upper face of the cover unit 205.

Figure 5:
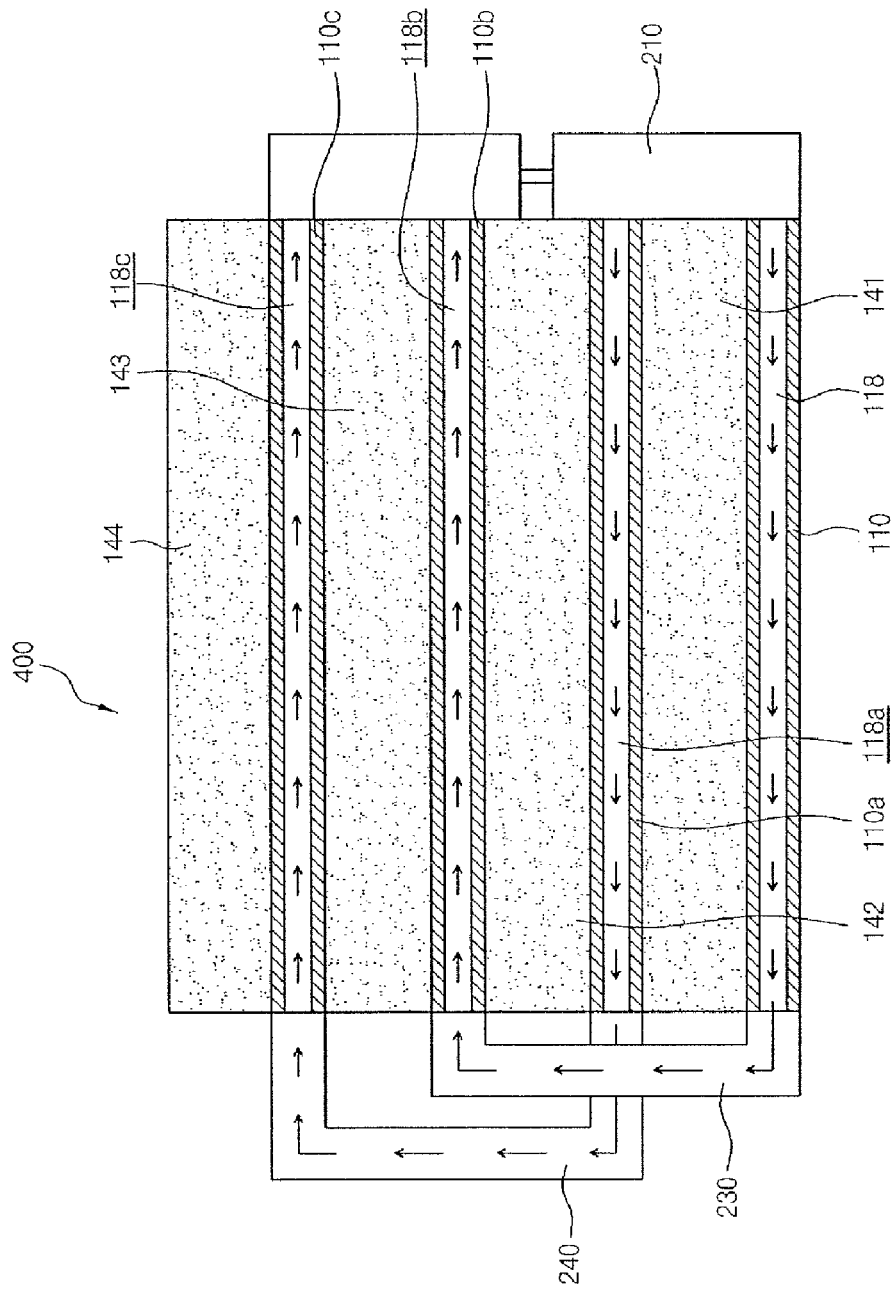
FIG. 5 is a cross-sectional view showing that a fluid supply unit and a fluid collection unit are mounted in the semiconductor package shown in FIG. 4.

FIG. 5 is a cross-sectional view showing that a fluid supply unit and a fluid collection unit are mounted in the semiconductor s package shown in FIG. 4.

Referring to FIG. 5, a first connection pipe 230 connects the fluid passages 118, 118b and is disposed at a second end opposing a first end of the fluid passage 118 and fluid passage 118b.

A second connection pipe 240 connects the fluid passages 118a, 118c and is disposed at a second end opposing a first end of the fluid passage 118a and fluid passage 118c.

The first end of the fluid passage 118 and the first end of the fluid passage 118a are respectively connected to the fluid supply unit 210 disposed at the first end of the fluid passage 118 and fluid passage 118a, which provides cooling fluid to the fluid passages 118, 118a.

The first end of the fluid passage 118b and the first end of the fluid passage 118c are respectively connected to the fluid collection unit 220 disposed at the first end of the fluid passage 118b and fluid passage 118c, which collects the fluid having been passed through the fluid passages 118, 118a, 118b, 118c.

Figure 6:
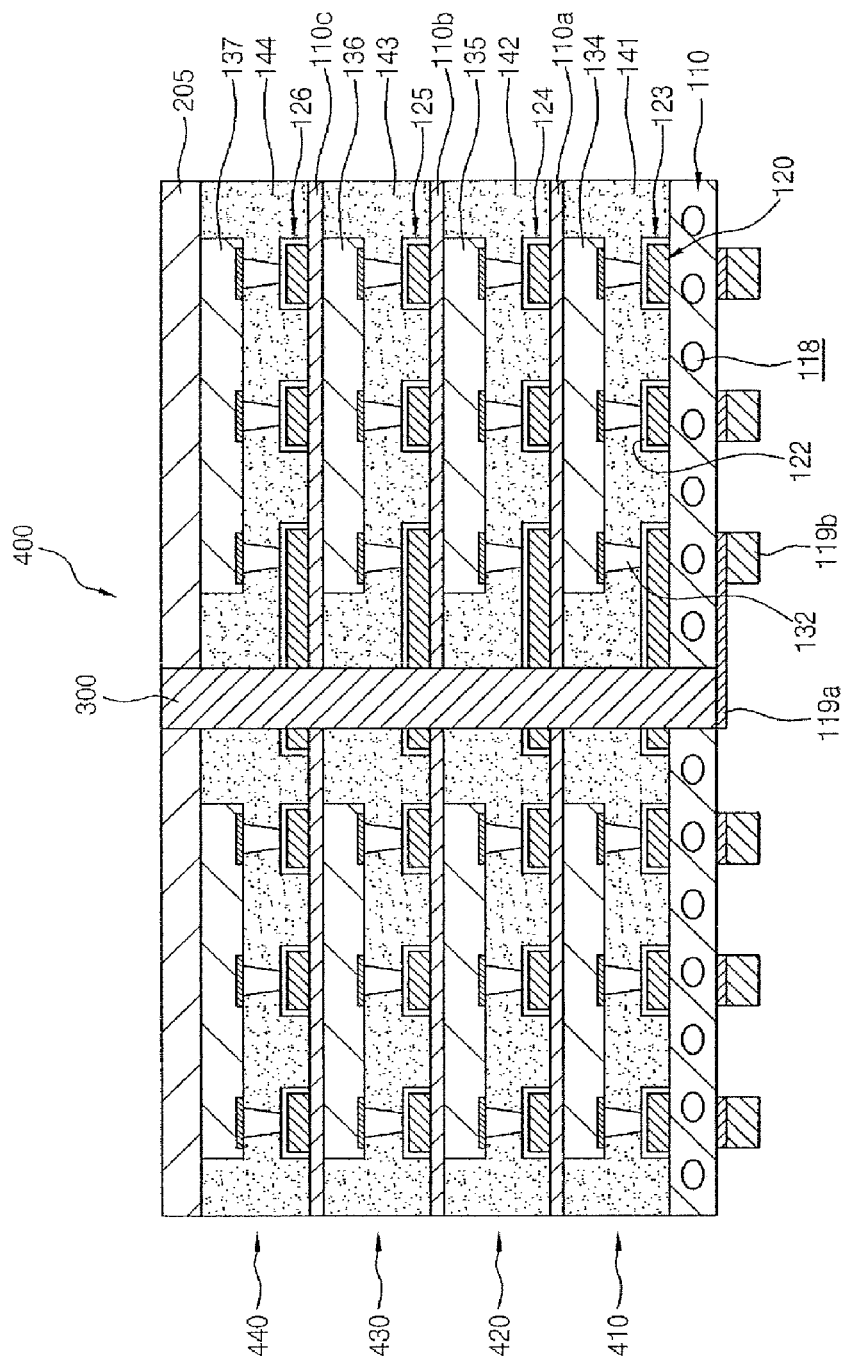
FIG. 6 is a cross-sectional view showing a semiconductor package in accordance with another embodiment of the present invention.

FIG. 6 is a cross-sectional view showing a semiconductor package in accordance with another embodiment of the present invention. The semiconductor package shown in FIG. 6 is substantially the same as the semiconductor package shown in FIG. 4, except for the fluid passages of the first insulation substrates. Therefore, identical reference numerals and names will be given to corresponding identical parts and a duplicated description to of the identical parts will be omitted.

Referring to FIG. 6, the semiconductor package 400 includes the first semiconductor package module 410 having the first insulation member 110 with the fluid passage 118, the second semiconductor package module 420 having the first insulation member 110a without the fluid passage, the third semiconductor package module 430 having the first insulation member 110b without the fluid passage, the fourth semiconductor package module 440 having the first insulation member 110c without the fluid passage, and the through electrode 300.

In the present embodiment as shown in FIG. 6, it is possible to significantly reduce the total volume and thickness of the semiconductor package 400 since only the first insulation member 110 of the first semiconductor package module 410 is selectively formed with the fluid passage 118 and the second through fourth semiconductor package modules 420, 430, 440 respectively include the first insulation members 110a, 110b, 110c *without the fluid passage*.

FIGS. 7 through 12 are cross-sectional views showing a method of fabricating a semiconductor package in accordance with an embodiment of the present invention.

Figure 7:
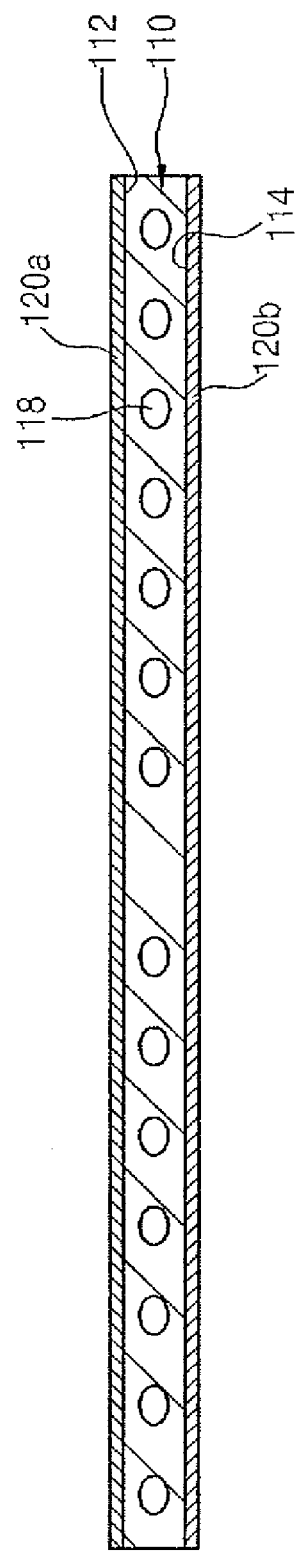
FIGS. 7 through 12 are cross-sectional views showing a method of fabricating a semiconductor package in accordance with an embodiment of the present invention.

Referring to FIG. 7, the semiconductor package module is fabricated first in order to begin fabrication of the semiconductor package.

In order to fabricate the semiconductor package module, the first insulation member 110 is prepared having a substantially planar shape and formed with the fluid passage 118 therein. The fluid passage 118 formed in the first insulation member 110 passes through the first insulation member 110 from a first side face of the first insulation member 110 to a second side face opposite the first side face.

The fluid passage 118 can be formed, for example, by a drilling process. For example, a plurality of fluid passages 118 can be formed parallel to each other within the first insulation member 110. The fluid passage 118 may be formed in a linear shape when viewing the first insulation member 110 in planar view from above.

Alternatively, the fluid passage 118 may have a curved shape when viewing the first insulation member 110 in planar view from above. The fluid passage 118 having the curved shape may be formed by forming the fluid passages 118 in two pieces of the first insulation members 110 respectively and then joining the first insulation members 110.

A metal film 120a is formed over the first face 112 of the first insulation member 110 formed with the fluid passage 118 to form the circuit pattern.

In the present embodiment, the metal film 120a can be, for example, a copper film. The metal film 120a can be attached to the first face 112 of the first insulation member 110 by an adhesive. Alternatively, the metal film 120a can be formed on the first face 112 of the first insulation member 110 using a plating method such as an electroless plating. In addition, a metal film 120b can be further formed on the second face 114 of the first insulation member 110 opposite the first face 112.

After the metal film 120a is attached or formed on the first insulation member 110, a photoresist film (not shown) is formed on the metal film 120a. The photoresist film is patterned using a photo process including an exposure process and a development process thereby forming the photoresist pattern (not shown) on the is metal film 120a.

Figure 8:
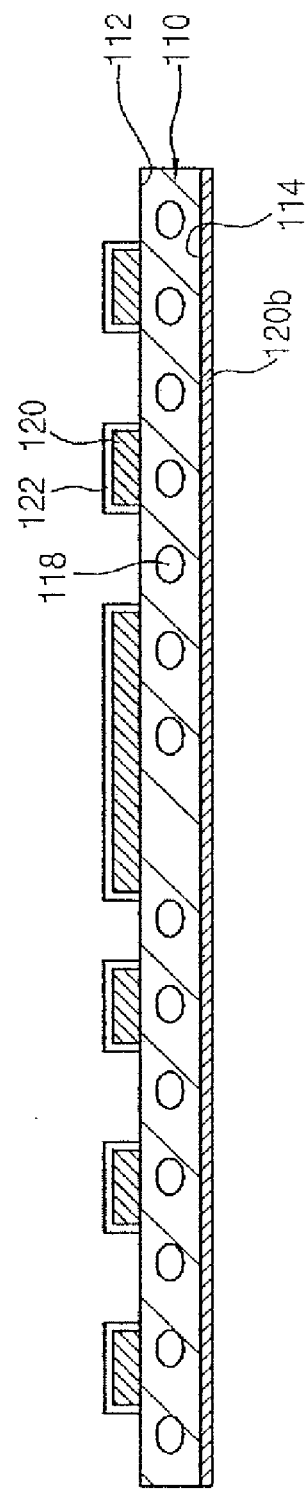

Referring to FIG. 8, after the photoresist pattern is formed on the metal film 120a, the metal film 120a is patterned using the photoresist pattern as an etch mask to form the circuit pattern 120 on the first face 112 of the first insulation member 110.

After the circuit pattern 120 is formed on the first face 112 of the first insulation member 110, a plating layer 122 can be formed on the surface of the circuit pattern 120. Examples of the material for the plating layer 122 may include gold, nickel, palladium and an alloy thereof.

Figure 9:
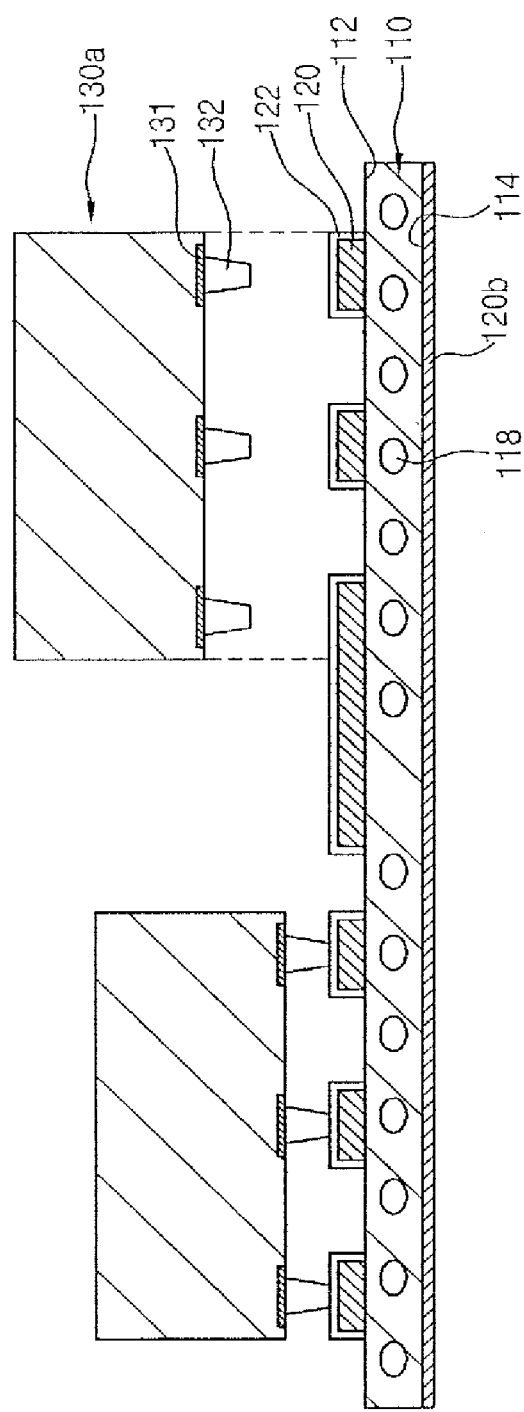

Referring to FIG. 9, after the circuit pattern 120 and the plating layer 122 are formed on the first face 112 of the first insulation member 110, the respective circuit patterns 120 are electrically connected to thick semiconductor chips 130a that are not subject to a back grinding process.

In the present embodiment, the semiconductor chips 130a are semiconductor chips that are not subject to the back grinding process after being singulated from a wafer (not shown). In the present embodiment, when the thick semiconductor chips 130a, to which are not subject to the back grinding process, are mounted, it is possible to prevent deflection and twist of the semiconductor chip 130a.

In the present embodiment, bonding pads are formed on the upper face of the semiconductor chips 130, respectively. The bonding pads 131 are electrically connected to bumps 132.

The bumps 132 of the semiconductor chips 130a are then bonded to the circuit pattern 120, for example, in a flip chip manner.

Meanwhile, when forming the circuit pattern 120 over the first face 112 of the first insulation member 110, a circuit pattern (not shown) for an electric device electrically connected with the circuit pattern 120 can be formed together over the first insulation member 110. In an embodiment of the present invention, the circuit pattern for an electric device is connected with an electric device. The electric device can be, for example, a diode, a transistor, a capacitor, a resistor, an inductor and the like.

Figure 10:
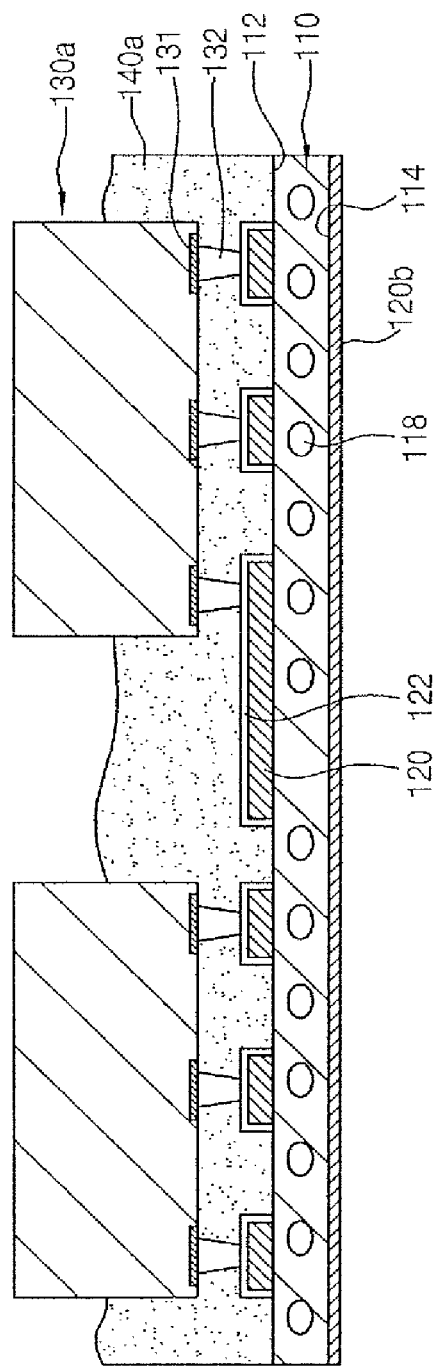

Referring to FIG. 10, after the semiconductor chips 130a are flip chip connected to the circuit pattern 120 formed over first face 112 of the first insulation member 110, a preliminary second insulation member 140a is formed over the first face 112 of the first insulation member 110. In order to form the preliminary second insulation member 140a, a flowable insulation material containing a solvent is formed between the semiconductor chips 130a disposed over the first face 112 of the first insulation member 110. Alternatively, the preliminary second insulation member 140a can be formed between the semiconductor chips 130a disposed over the first face 112 of the first insulation member 110 by disposing an insulation plate containing a thermosetting material and then applying heat and pressure to the insulation plate.

Figure 11:
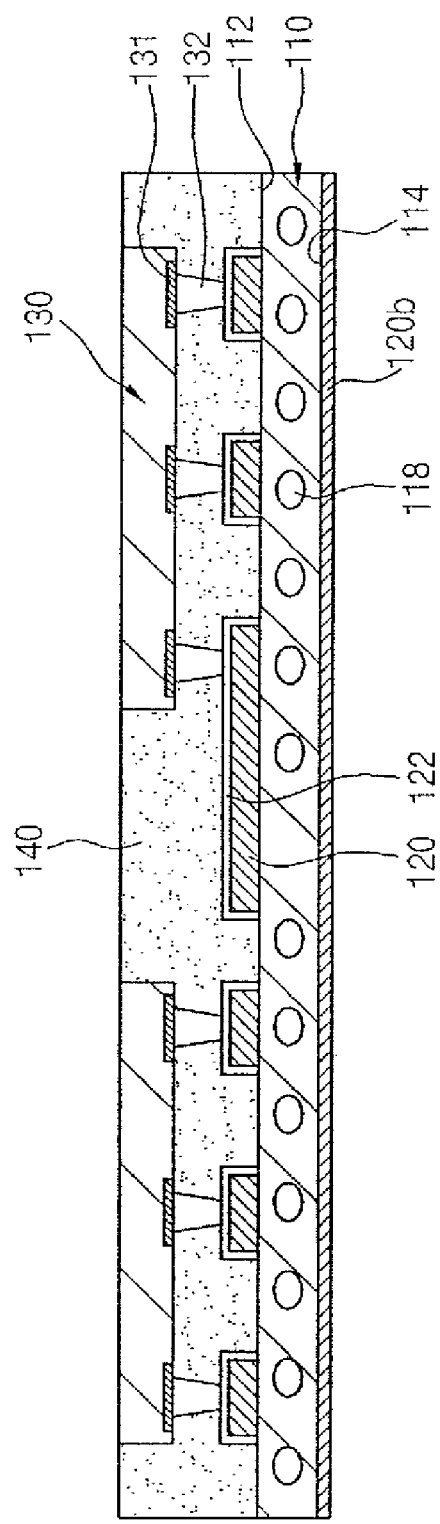

Referring to FIG. 11, after the thick semiconductor chips 130a and the preliminary second insulation member 140a are formed over the first face 112 of the first insulation substrate 110, the rear faces of the semiconductor chips 130a and the preliminary second insulation member 140a are polished, for example, by Chemical Mechanical Polishing (CMP) process. As a result, the semiconductor chip have a significantly reduced thickness. The preliminary second insulation member 140a is also polished to form the polished second insulation member 140. As a result, the semiconductor chips 130 and the second insulation member 140 are formed to have a substantially coplanar surface.

Subsequently, as shown in FIG. 1, the through hole for exposing the circuit pattern 120 is formed in the second insulation member 140 by a drilling process or a laser drilling process. The through electrode 300 is then formed within the through hole. To form the through electrode, a metal seed layer is formed on an inner surface of the second insulation member 140 and metal can be filled in the through hole by a plating process using the metal seed layer.

Figure 12:
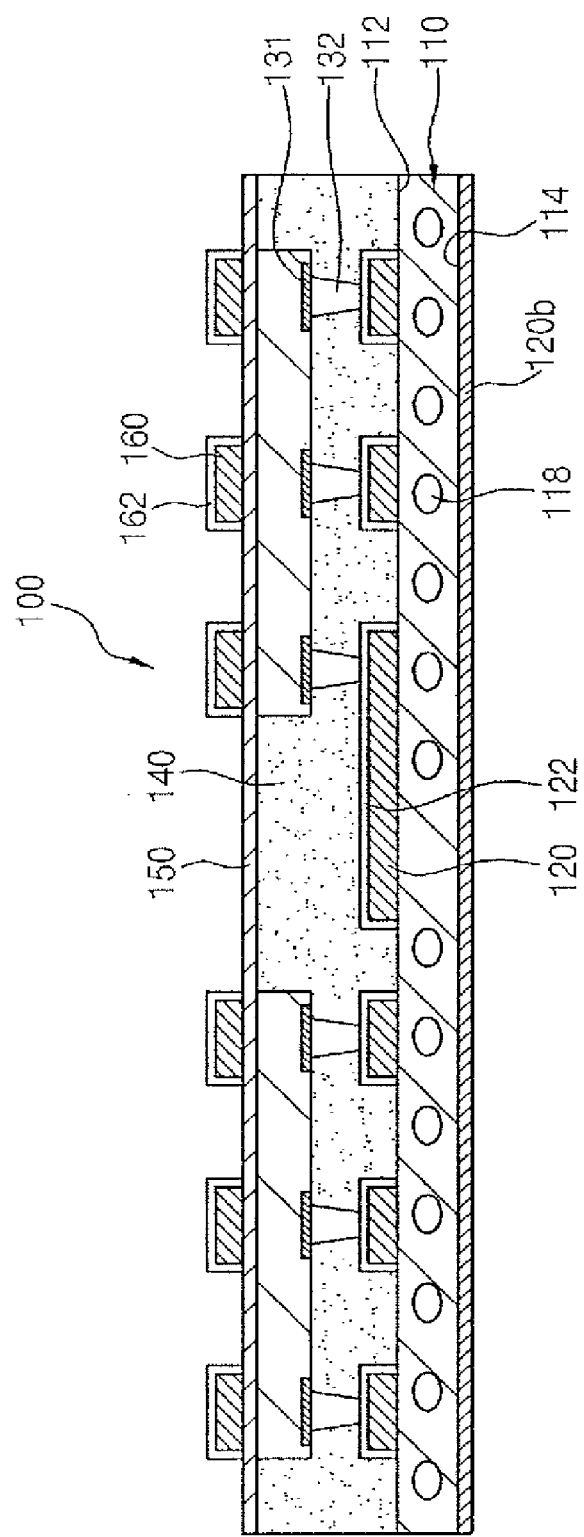

Referring to FIG. 12, after the polished semiconductor chip 130 and the polished second insulation member 140 are formed on the first insulation member 110, an insulation film 150 may be formed over the semiconductor chips 130 and the second insulation member 140. In the present embodiment, the insulation film 150 can be, for example, an organic film or an inorganic film.

A metal film (not shown) for forming the additional circuit pattern is formed on the insulation film 150.

In the present embodiment, the metal film can be, for example, a copper film. Alternatively, the metal film can be formed by forming a metal seed layer over the insulation film 150 and then performing a plating process such as an electroplating.

After the metal film is attached or formed on the insulation film 150, a photoresist film (not shown) is formed on the metal film. The photoresist film is patterned by a photo process including an exposure process and a development process to form the photoresist pattern having substantially the same shape as the circuit pattern on the metal film.

After the photoresist pattern is formed on the metal film, the metal film is patterned using the photoresist pattern as an etch mask to form the additional circuit pattern 160 on the insulation film 150.

A plating layer 162 can be formed on the surface of the additional circuit pattern 160 after the additional circuit pattern 160 is formed. Examples of the material for the plating layer 162 may include gold, nickel, palladium and an alloy thereof.

Referring again to FIG. 4, the semiconductor package module 400 fabricated using the process described in FIGS. 7 through 12 can be stacked multiple times to enhance the data storage capacity and the data processing speed. In the present embodiment, when stacking a plurality of semiconductor packages 400 shown in FIG. 1, the through electrode 300 is formed after the plurality of the semiconductor packages are stacked.

Meanwhile, a cover unit can be disposed on the semiconductor chip 130 of the uppermost semiconductor package module 100 after the semiconductor package 400 is formed having the plurality of semiconductor package modules 100. The cover unit 205 may have additional circuit wiring that is electrically connected with the through electrode 300.

A fluid supply unit 210 and fluid connection unit 230 and 240 is then formed after the semiconductor package 400 having the semiconductor package modules 100 is fabricated. The fluid supply unit 210 can be disposed at a first end of the fluid passage 118 to provide cooling fluid to the fluid passage 118 formed in the first insulation member 110 of each semiconductor package module 100. The fluid collection unit 210 for collecting the cooling fluid can be disposed at a second end of the fluid passage 118 opposite the first end. In the present embodiment, where the semiconductor package 400 includes a plurality of first insulation members 110, the fluid passages 118 of the first insulation members 110 can be connected to each other using connection pipes.

Although in the present embodiment, the first insulation members 110 of the plurality of semiconductor package is modules 100 are formed with respective fluid passages 118, the fluid passage 118 may be selectively formed in only the first insulation member 118 of the lowermost semiconductor package module 100 of the plurality of the semiconductor package modules 100, as shown in FIG. 6.

As is apparent from the above description, it is possible to quickly discharge heat generated from the semiconductor package having a plurality of stacked semiconductor chips to thereby further enhance the performance of the semiconductor package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for fabricating a semiconductor package, comprising the steps of:
    forming a semiconductor package module comprising a first insulation member having an insulation body and at least one fluid passage formed in the first insulation body, circuit patterns formed on a first face of the first insulation member, plating layers directly contacting and covering the circuit patterns, bumps directly contacting the plating layer, semiconductor chips comprising bonding pads that directly contact the bumps such that the semiconductor chips are electrically connected to the circuit patterns respectively through the bumps and the plating layers, and a second insulation member covering the first insulation member, the circuit patterns, and a portion of the semiconductor chips; and
    forming a through electrode passing through the second insulation member and being electrically connected to the circuit patterns.

2. The method according to claim 1, further comprising, before the step of forming the through electrode, a step of stacking a plurality of semiconductor package modules.

3. The method according to claim 1, further comprising the steps of:
    connecting a fluid supply unit for providing fluid to a first end of the at least one fluid passage; and
    connecting a fluid collecting unit for collecting the fluid to a second end opposite the first end of the at least one fluid passage.

4. The method according to claim 1, wherein the step of forming the semiconductor package module includes the steps of:
    forming an insulation film on the semiconductor chips and the second insulation member and the insulation film having an opening exposing the through electrode; and
    forming an additional circuit pattern on the insulation film and being electrically connected with the through electrode.

* * * * *